United States Patent [19]

Sekiguchi

[11] Patent Number: 5,576,927
[45] Date of Patent: Nov. 19, 1996

[54] ELECTROLYTIC CHIP CAPACITOR

[75] Inventor: Yoshinori Sekiguchi, Tokyo, Japan

[73] Assignee: NEC Corporation, Tokyo, Japan

[21] Appl. No.: 550,860

[22] Filed: Oct. 31, 1995

[30] Foreign Application Priority Data

Oct. 31, 1994 [JP] Japan .................................. 6-266739

[51] Int. Cl.[6] .......................... H01G 4/228; H01G 4/248; H05K 5/06
[52] U.S. Cl. .................... 361/306.1; 361/301.3; 361/310; 361/535; 361/539; 361/536; 174/52.2
[58] Field of Search ............................ 361/301.1, 301.3, 361/303, 306.1, 307, 308.1, 310, 517–520, 535–539; 257/787, 924; 174/52.2

[56] References Cited

U.S. PATENT DOCUMENTS 5,224,021   6/1993   Takada et al. ........................ 174/52.2
5,466,887   11/1995   Hasegawa .............................. 174/52.2

Primary Examiner—Bot L. Ledynh
Attorney, Agent, or Firm—Sughrue, Mion, Zinn, Macpeak & Seas

[57] ABSTRACT

A solid electrolytic chip capacitor in which L-shaped portions of the anode terminal and cathode terminal form slanting surfaces which project beyond the projecting side surfaces of the resin sheathing.

2 Claims, 2 Drawing Sheets

ELECTROLYTIC CHIP CAPACITOR

BACKGROUND OF THE INVENTION

1. Field of the Invention

The present invention relates to a solid electrolytic chip capacitor, and particularly to an improvement of the anode terminal and cathode terminal construction of a solid electrolytic chip capacitor.

2. Description of the Related Art

Solid electrolytic chip capacitors generally have the solid electrolytic capacitor construction shown in FIG. 1 employing, for example, tantalum.

Such a solid electrolytic chip capacitor is manufactured as follows: Valve metal wire such as a tantalum wire (constituting anode lead 2) is first implanted into powder of valve metal such as tantalum, and after pressure forming and vacuum sintering to produce a sintered body, a dielectric oxide film is formed on the sintered body. A semiconductor layer and a dielectric layer are next successively formed on this dielectric oxide film to produce capacitor element 1. Cathode terminal 13 is then connected to capacitor element 1, and anode lead 2 is connected to anode terminal 14. Next, capacitor element 1 and anode lead 2, together with each connection portion of cathode terminal 13 and anode terminal 14, are entirely covered by resin sheathing 15. Finally, the exposed portions of cathode terminal 13 and anode terminal 14 are bent into L-shapes along side surfaces 15a, 15b and bottom surfaces 15c, 15d of resin sheathing 15.

However, in solid electrolytic chip capacitors of the prior art such as described in Japanese Utility Model Publication No. 32737/89, projecting surfaces 15e, 15f are provided on the side surfaces of resin sheathing 15 at east above the emergence points of anode terminal 14 and cathode terminal 13 to produce a surface substantially parallel to the outer surface of anode terminal 14 and cathode terminal 13. Alternatively, as described in Japanese Patent Publication No. 30977/91, the outer side surfaces of anode terminal 14 and cathode terminal 13 are provided substantially parallel to the outer side surface of the resin sheathing 15.

In a solid electrolytic chip capacitor according to the above-described prior art, the outer side surfaces tapers to facilitate removal from the die when sheathing with resin, and the form of the anode terminal and cathode terminal therefore conform with this taper during the bending process that follows resin sheathing. As a result, the anode terminal and cathode terminal on the outer side surfaces of a solid electrolytic chip capacitor incline slightly from perpendicular toward the body of the capacitor.

In such an arrangement, the anode terminal and cathode terminal are concealed behind the projecting surfaces above the lead-out points of the anode and cathode terminals, thereby preventing contact of flowed solder with the anode terminal and cathode terminal. As a result, there is a danger of failure of soldering of solid electrolytic chip capacitors to printed-circuit boards, particularly if the printed-circuit boards are mounted on an extremely rapidly moving conveyor during attachment of capacitors to printed-circuit boards by flow soldering.

SUMMARY OF THE INVENTION

The object of the present invention is to provide a solid electrolytic chip capacitor that can be more easily soldered to a printed-circuit board.

To achieve this object, the present invention provides a solid electrolytic chip capacitor comprising:

a capacitor element;

a box-shaped resin sheathing portion that sheathes the capacitor element; and an anode terminal and cathode terminal in the form of two mutually opposed L-shapes that emerge from the side surfaces of the resin sheathing portion, the capacitor element being interposed between;

the resin sheathing portion having projecting side surfaces above the emergence points of the anode terminal and the cathode terminal, and the L-shaped portions of the anode terminal and the cathode terminal forming slanting surfaces that project beyond the projecting surfaces of the resin sheathing portion.

This configuration facilitates soldering to a printed board, particularly in flow soldering, because the L-shaped portions of the anode terminal and cathode terminal form slanting surfaces that project beyond the projecting surfaces of the resin sheathing portion.

Furthermore, the anode terminal and cathode terminal may each be provided with at least one protruding portion on the side of the resin sheathing surface.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 1:
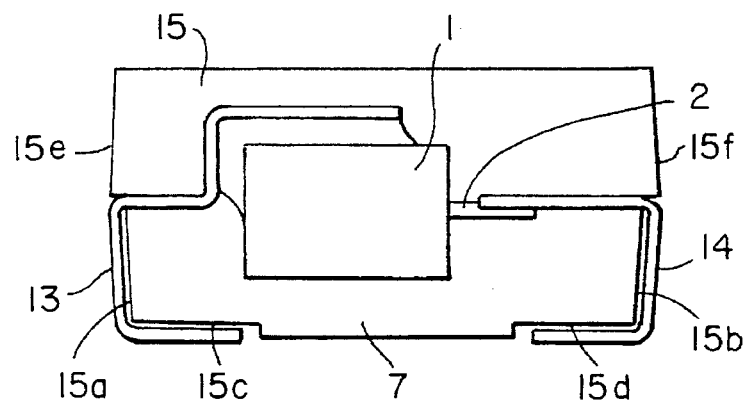
FIG. 1 shows the construction of an electrolytic chip capacitor of the prior art.
Figure 2:
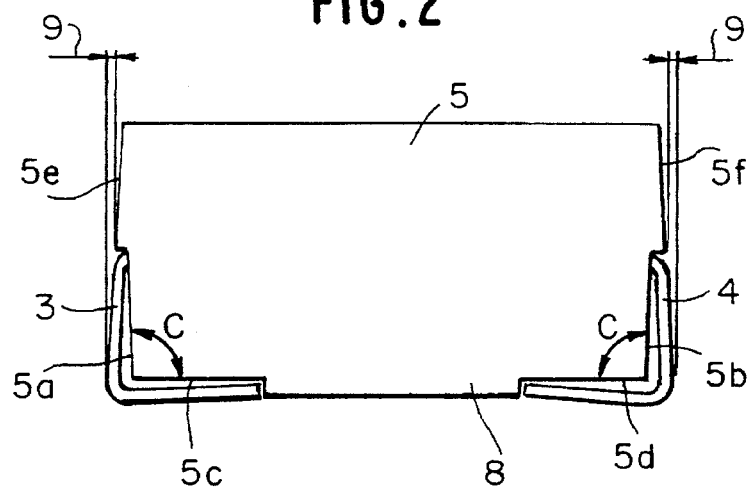
FIG. 2 is a side view of an electrolytic chip capacitor according to the first embodiment of the present invention.

FIG. 2 is a side view of a solid electrolytic chip capacitor according to the first embodiment of the present invention. In this embodiment, the ends of anode terminal 4 and cathode terminal 3 closely contact the edges of standoff 8; and because anode terminal 4 and cathode terminal 3 have been pre-cut to a length that is longer than the circumference from the emergence point of the terminals to the standoff at the bottom portion of the capacitor, the L-shaped portions of anode terminal 4 and cathode terminal 3 form slanting surfaces that project the distance of gap 9 beyond the projecting side surfaces 5e, 5f of resin sheathing 5.

The solid electrolytic chip capacitor of this embodiment can be manufactured, for example, as follows:

A metal powder having valve action such as tantalum is pressure formed to a prescribed shape, and following vacuum sintering, subjected to anodic oxidation. A capacitor element (not shown) formed by successively coating a manganese dioxide semiconductor layer and a graphite and silver paste layer is then connected to cathode terminal 3 and anode terminal 4, respectively, the silver paste layer by, for example, a conductive glue, and the anode lead (not shown) by welding. Next, the capacitor element and anode leads are entirely covered by resin sheathing 5 such that projecting side surfaces 5e, 5f are provided above the emergence points of anode terminal 4 and cathode terminal 3. Finally, the exposed portions of cathode terminal 3 and anode terminal 4 are subjected to a bending process from the points of emergence from the resin sheathing 5 and along the lower side surfaces 5a, 5b and bottom surfaces 5c, 5d of resin sheathing 5 to produce mutually confronting L-shapes. At this time, anode terminal 4 and cathode terminal 3 are made longer than terminals of the prior art, the terminals being cut to a length of, for example, the order of 0.2 mm longer than the circumference from the emergence point of the terminals to the edges of standoff 8 at the bottom of the capacitor unit; the bending point being bent in the bending process to a smaller angle than the angle C formed by the side surfaces 5a, 5b and bottom surfaces 5c, 5d of resin sheathing 5; and the end portions of anode terminal 4 and cathode terminal 3 being affixed to the edge of standoff 8. Still, the distance from the emergence point of the terminals to the bending points is unchanged from the prior art.

Table 1 shows the results of comparison of solderability (number of defects/number sampled) for prior art articles and articles of the present embodiment under conditions particularly conducive to failure.

TABLE 1

| Soldering conditions | Prior art articles | Present embodiment |
| --- | --- | --- |
| A | 13/1000 | 2/1000 |
| B | 5/1000 | 0/1000 |

Here, A indicates a case in which the conveyor speed was 1.5 m/min, and B indicates a case in which conveyor speed was 1.3 m/min.

As shown in Table 1, the rate of defective soldering for solid electrolytic chip capacitors according to the present embodiment was reduced to less than half that for capacitors of the prior art.

Figure 3:
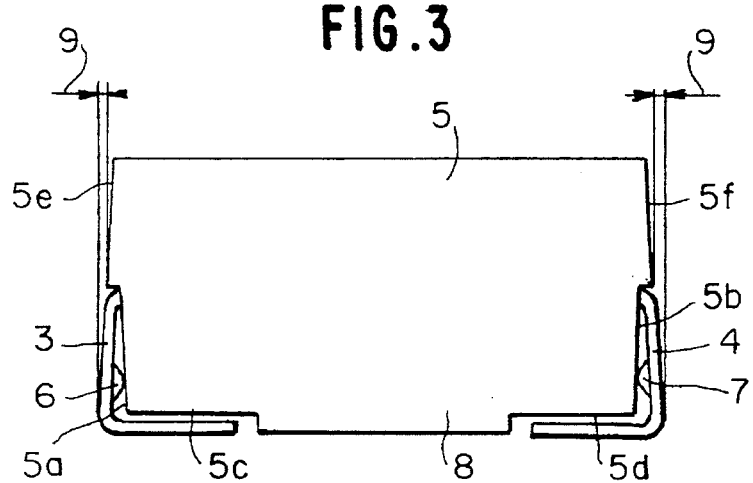
FIG. 3 is a side view of an electrolytic chip capacitor according to a second embodiment of the present invention.

FIG. 3 is a side view of a solid electrolytic chip capacitor according to the second embodiment of the present invention. In this embodiment, a protrusion 6, 7 is provided on each of anode terminal 4 and cathode terminal 3 on the side facing the side surfaces 5a, 5b of the resin sheathing, the L-shaped portions of anode terminal 4 and cathode terminal 3 thereby present slanting surfaces that project beyond the projecting surfaces 5e, 5f of resin sheathing 5.

Figure 4A:
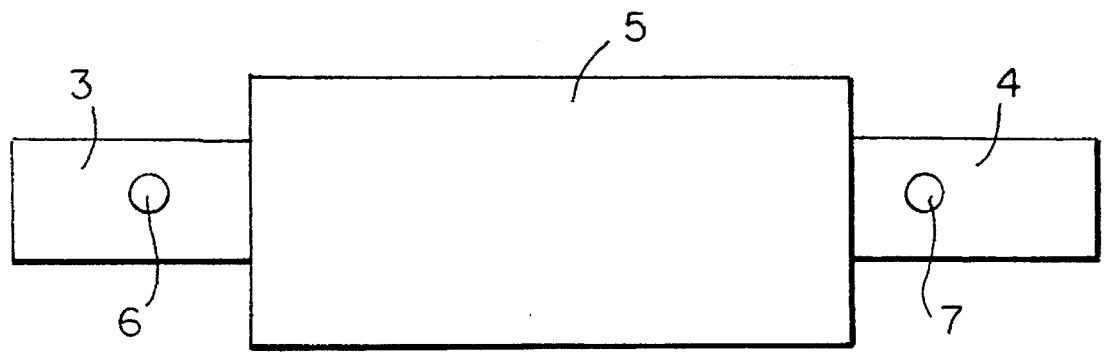
FIG. 4A and 4B are views of the upper and lower surfaces, respectively, immediately following processing of the protruding portions 6, 7 of the electrolytic chip capacitor according to the second embodiment.
Figure 4B:
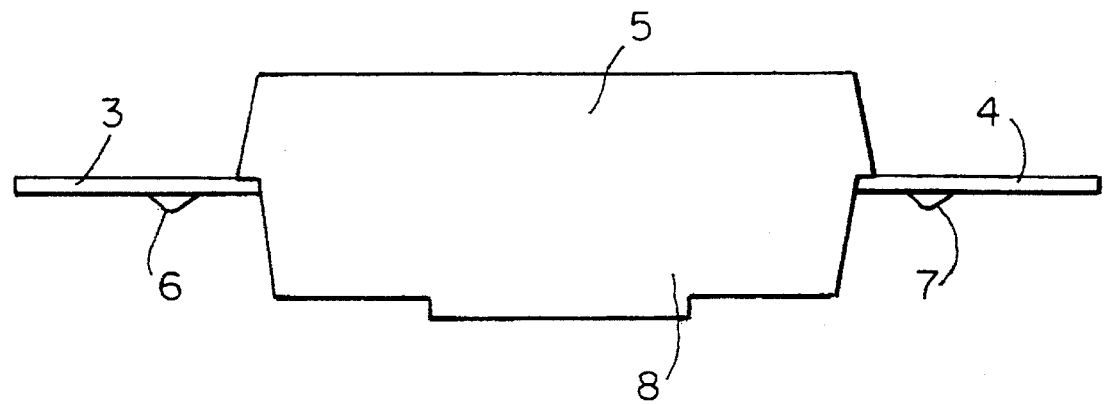

The solid electrolytic chip capacitor of this embodiment is manufactured by the following method: An anode lead and capacitor element manufactured in the same manner as the first embodiment are entirely coated with resin sheathing 5. The exposed portions of cathode terminal 3 and anode terminal 4 from the point of emergence from resin sheathing 5 are then bent into L shapes along the lower side surfaces 5a, 5b and bottom surfaces 5c, 5d of resin sheathing 5. At this time, round protrusions 6, 7 having a diameter of, for example, 0.3 mm and facing toward side surfaces 5a, 5b of resin sheathing 5 are formed by a pressing process. The height of protrusions 6, 7 is preferably from 0.1 mm to 0.2 mm. By adjustment of the position and height of protrusions 6, 7, the desired angle of slant of the surfaces of anode terminal 4 and cathode terminal 3 can be obtained. FIGS. 4A and 4B show the upper surface and side surface, respectively, of the solid electrolytic chip capacitor immediately following processing of protrusions 6, 7.

While preferred embodiments of the invention have been described using specific terms, such description is for illustrative purposes only, and it is to be understood that changes and variations may be made without departing from the spirit or scope of the following claims.

What is claimed is:

1. A solid electrolytic chip capacitor comprising:

a capacitor element;

a box-shaped resin sheathing portion that sheathes said capacitor element; and an anode terminal and cathode terminal in the form of two mutually opposed L-shapes that emerge from the side surfaces of said resin sheathing portion, said capacitor element being interposed between;

said resin sheathing portion having projecting side surfaces above the emergence points of said anode terminal and said cathode terminal, and an extended standoff portion at a bottom surface thereof; and wherein the L-shaped portions of said anode terminal and said cathode terminal have a length that is longer than a circumference from the emergence point of said terminals to said standoff portion so that when a tip of each of said terminals touches said standoff portion, said terminals are forming slanting surfaces that project beyond the projecting surfaces of said resin sheathing portion.

2. A solid electrolytic chip capacitor comprising:

a capacitor element;

a box-shaped resin sheathing portion that sheathes said capacitor element; and an anode terminal and cathode terminal in the form of two mutually opposed L-shapes that emerge from the side surfaces of said resin sheathing portion, said capacitor element being interposed between;

said resin sheathing portion having projecting side surfaces above the emergence points of said anode terminal and said cathode terminal, and the L-shaped portions of said anode terminal and said cathode terminal forming slanting surfaces that project beyond the projecting surfaces of said resin sheathing portion, wherein said anode terminal and said cathode terminal are each provided with at least one protruding portion on the side of the resin sheathing surface.

* * * * *